United States Patent
Hsu

(10) Patent No.: US 9,546,780 B2
(45) Date of Patent: Jan. 17, 2017

(54) LIGHT SOURCE MODULE

(71) Applicant: AU Optronics Corporation, Hsin-Chu (TW)

(72) Inventor: Ming-Ji Hsu, Hsin-Chu (TW)

(73) Assignee: AU OPTRONICS CORPORATION, Hsin-chu (TW)

( * ) Notice: Subject to any disclaimer, the term of this patent is extended or adjusted under 35 U.S.C. 154(b) by 327 days.

(21) Appl. No.: 14/228,356

(22) Filed: Mar. 28, 2014

(65) Prior Publication Data

US 2014/0369042 A1 Dec. 18, 2014

(30) Foreign Application Priority Data

Jun. 14, 2013 (TW) .............................. 102121141 A

(51) Int. Cl.
*F21V 23/00* (2015.01)
*H05K 1/02* (2006.01)
*H05K 3/34* (2006.01)
*F21Y 101/00* (2016.01)

(52) U.S. Cl.
CPC ............ *F21V 23/00* (2013.01); *H05K 1/0296* (2013.01); *F21Y 2101/00* (2013.01); *H05K 3/3421* (2013.01); *H05K 2201/10106* (2013.01); *H05K 2201/10757* (2013.01)

(58) Field of Classification Search
CPC .............................. F21V 23/00; H05K 1/0296
See application file for complete search history.

(56) References Cited

U.S. PATENT DOCUMENTS

| | | |
|---|---|---|
| 2009/0046456 A1 | 2/2009 | Urano et al. |
| 2010/0188005 A1 | 7/2010 | Van Herpen et al. |
| 2011/0080754 A1* | 4/2011 | Wang ................... G02B 6/0068 362/613 |

* cited by examiner

*Primary Examiner* — Elmito Breval
(74) *Attorney, Agent, or Firm* — McClure, Qualey & Rodack, LLP

(57) ABSTRACT

A light source module includes a substrate, a circuit, at least one first light source unit, and at least one second light source. The circuit is disposed on the substrate and includes a first signal channel and a second signal channel. The first light source unit is disposed on a bearing surface, wherein the first light source unit has a first A pin and a first B pin having different polarity from the first A pin. The second light source unit is disposed on the bearing surface and is adjacent to the first light source unit, wherein the second light source unit has a second A pin and a second B pin having different polarity from the second A pin, and the second A pin is adjacent to the first A pin of the first light source unit and has a same polarity with the first A pin.

10 Claims, 6 Drawing Sheets

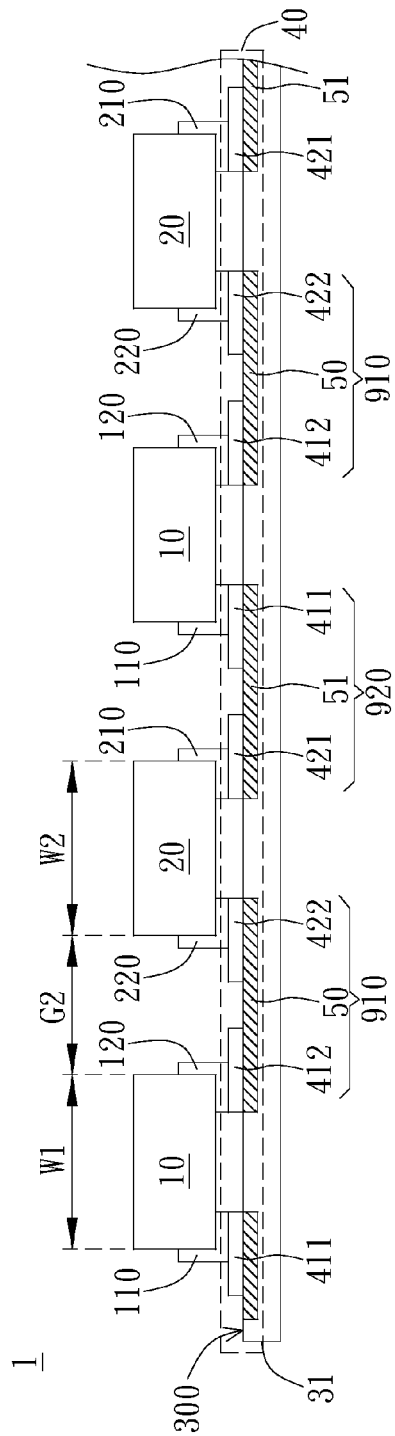
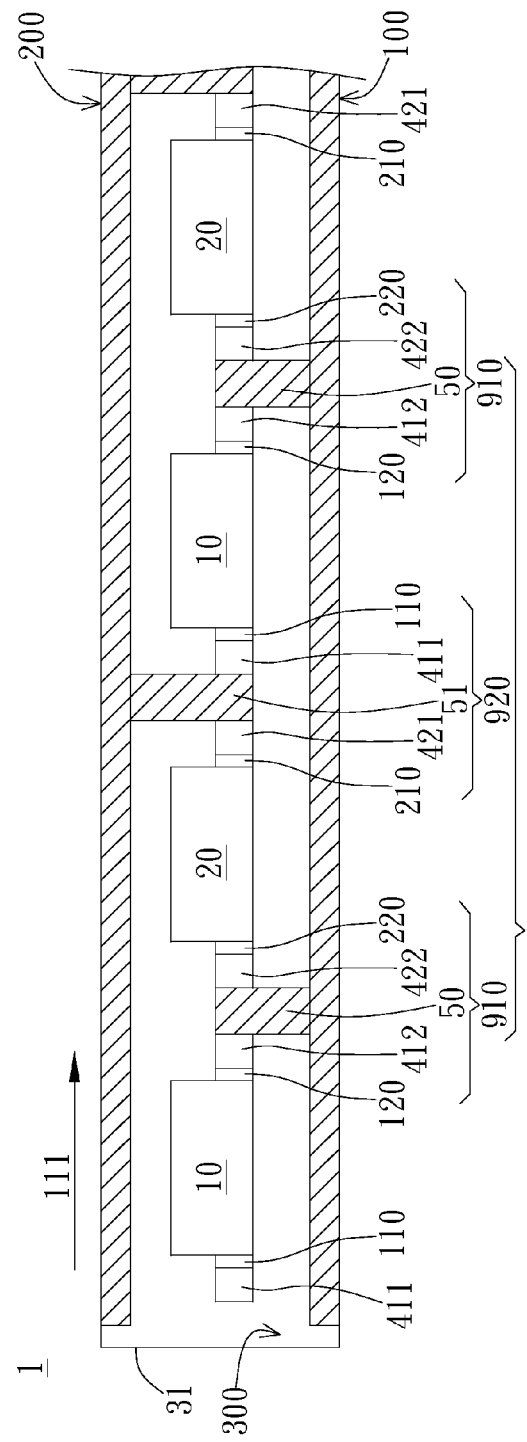
FIG. 2A
FIG. 2B

LIGHT SOURCE MODULE

BACKGROUND OF THE INVENTION

1. Field of the Invention

The present invention generally relates a light source module; particularly, the present invention relates a light source module which can decrease the cost and increase the brightness.

2. Description of the Prior Art

As shown in FIG. 1, FIG. 1 is a schematic view of a conventional light source module, wherein a light source unit 2A and a light source unit 2B are disposed on a substrate 3. Each of the light source units 2A and 2B has a width W and a spacing G exists between the light source units 2A and 2B. The pitch P of the light source unit 2A and the light source unit 2B is a distance between an edge 21A of the light source unit 2A and an edge 21B of the light source unit 2B. The pitch P can also refer to a sum of the width W and the spacing G. It is noted that the spacing G represents a width allowing the disposition of a layout area between the light source unit 2A and the light source unit 2B. The amount of the light source units allowed to be disposed on the substrate can be directly estimated from a relation between the length of the substrate 3 and the pitch P of the adjacent light source units. In addition, a positive electrode end and a negative electrode end of the light source unit 2A are respectively connected with a pad 4 and a pad 5; a positive electrode end and a negative electrode end of the light source unit 2B are respectively connected with a pad 6 and a pad 7.

It is noted that the pads are connected with a circuit (not shown) through the conducting wires 8. Particularly, the R&D people need to reserve the spacing between the adjacent light source units on the substrate 3 for the layout of the conducting wires 8. As shown in FIG. 1, the conducting wire 8 on the substrate 3 has a wire space width L. In practical applications, there is a gap between adjacent conducting wires 8 (i.e. the wire has a certain distance to the adjacent wire) for avoiding the noise. The wire space width L is a major factor to influence the magnitude of the pitch P. However, in the present design structure, it is difficult to decrease the width of the conducting wire 8 and the spacing between adjacent conducting wires, so that the pitch P is difficult to be decreased. Particularly, in the case that the substrate 3 has a given area, the increase in amount of light source units is limited, so that the overall brightness of the light source is restricted. In addition, the conducting wire 8 connected with the pad 5 has a negative electrical signal, and the conducting wire 8 connected with the pad 6 has a positive electrical signal, so the two conducting wires 8 cannot share a common wire. As a result, the pitch P cannot be further decreased.

For instance, the length of the light source module for a 10-inch tablet is about 216.81 mm. If the width W of the light source unit is 3.8 mm and the spacing G is 1.5 mm (i.e. the pitch P is 5.3 mm), the amount of light source units allowed to be arranged is merely about 40. In addition, if the width W of the light source unit is 2.8 mm and the spacing G is 1.8 mm (i.e. the pitch P is 4.6 mm), the amount of light source units allowed to be arranged is merely about 48. In these two cases, the amount of light source units is insufficient to increase the brightness, and the overall brightness of the light source module cannot be increased.

SUMMARY OF THE INVENTION

In view of prior art, the present invention provides a light source module which can increase the brightness and control the cost of the materials.

It is an object of the present invention to provide a light source module with a single-layer substrate which can reduce the spacing between adjacent light source units to increase the density of the light source units.

It is an object of the present invention to provide a backlight module which modifies the pin orientation to simplify the layout of the circuit.

In one aspect, the present invention provides a light source module including a substrate, a circuit, at least one first light source unit, and at least one second light source unit. The substrate has a bearing surface. The circuit is disposed on the substrate and includes a first signal channel and a second signal channel. The at least one first light source unit is disposed on the bearing surface, wherein the first light source unit has a first A pin and a first B pin having different polarity from the first A pin. The at least one second light source unit is disposed on the bearing surface and is adjacent to the at least one first light source unit, wherein the at least one second light source unit has a second A pin and a second B pin having different polarity from the second A pin, and the second A pin is adjacent to the first A pin of the first light source unit and has a same polarity with the first A pin. The first A pin and the second A pin are connected with the first signal channel; the first B pin and the second B pin are connected with the second signal channel.

It is another object of the present invention to provide a light source module which includes a substrate, a circuit, a first light source unit, a second light source unit, and a third light source unit. The substrate has a bearing surface. The circuit is disposed on the substrate and includes a first signal channel and a second signal channel. The first light source unit is disposed on the bearing surface, wherein the first light source unit has a first A pin and a first B pin on two sides. The second light source unit is disposed on the bearing surface and is located adjacent to the first A pin of the first light source unit, wherein the second light source has a second A pin and a second B pin, and the second A pin is disposed to be adjacent to the first A pin and is electrically connected to the first signal channel with the first A pin. The third light source unit is disposed on the bearing surface and is located adjacent the first B pin of the first light source unit, wherein the third light source unit has a third A pin and a third B pin, and the third B pin is disposed to be adjacent to the first B pin and is electrically to the second signal channel with the first B pin.

Compared to the prior arts, the light source module of the present invention modifies the pin arrangement of adjacent light source units, so that the pins having the same polarity is adjacently disposed to decrease the amount of the conducting wires so as to decrease the layout area between the light source units, further shortening the spacing between the first light source unit and the second light source unit. In practical applications, the light source module is a circuit board having a single strip of light bar, and the cost of the materials is cheap so as to save the cost. In practical applications, if the width of the light source unit is 3.8 mm, the prior art of FIG. 1 can accommodate only 40 light source units; however, the present invention can accommodate 48 light source units. If the width of the light source unit is 2.8 mm, the prior art of FIG. 1 can accommodate only 48 light source units; however, the present invention can accommodate 56 light source units. In other words, the light source module of the present invention can effectively shorten the spacing between the light source units to increase the amount of the light source units, further increasing the overall brightness.

The detailed descriptions and the drawings thereof below provide further understanding about the advantage and the spirit of the present invention.

BRIEF DESCRIPTION OF THE DRAWINGS

FIG. 2A is a side view of an embodiment of a light source module of the present invention;

FIG. 2B is a top view of the embodiment of the light source module of the present invention;

DETAILED DESCRIPTION OF THE PREFERRED EMBODIMENT

Figure 1:
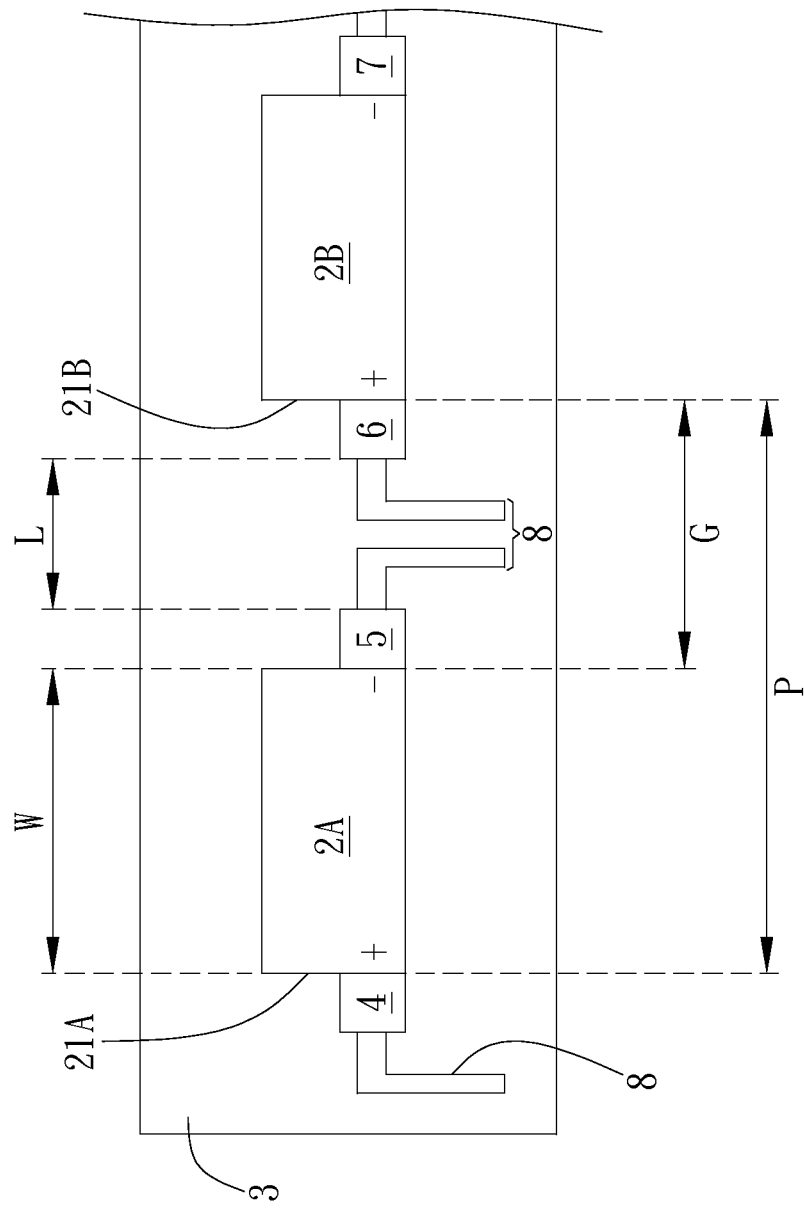
FIG. 1 is a schematic view of a conventional light source module.

According to an embodiment of the present invention, a light source module is provided to increase the density of the light source units. In the embodiment, the light source module can be a light source module for display devices.

Please refer to FIG. 2A; FIG. 2A is a side view of an embodiment of a light source module of the present invention. As shown in FIG. 2A, the light source module 1 includes a substrate 31, a circuit 40, at least one first light source unit 10, and at least one second light source unit 20. In the embodiment, the first light source unit 10 and the second light source unit 20 can be LED light sources, but not limited thereto. In addition, the substrate 31 has a bearing surface 300, and the circuit 40 is disposed on the substrate 31 and includes a first signal channel 910 and a second signal channel 920. It is noted that the light source module 1 is a single-layer circuit board; in other words, the substrate 31 of the light source module 1 is a single-layer substrate; the layout and entire electronic components are disposed on a same surface (on the bearing surface 31) of the substrate 31. It is noted that the first light source unit 10 and the second light source unit 20 can be the light source units having same or different color, but not limited thereto. In the embodiment, the first light source unit 10 and the second light source unit 20 are the light source units having same color; the present invention utilizes different reference numerals (10 and 20) to illustrate the arrangement of the light source units.

As shown in FIG. 2A, the first light source units 10 and the second light source units 20 are interlacedly disposed on the bearing surface 300, wherein the second light source unit 20 is adjacent to the first light source unit 10. The first light source unit 10 has a first A pin 120 and a first B pin 110 having different polarity from the first A pin 120. The second light source unit 20 has a second A pin 220 and a second B pin 210 having different polarity from the second A pin 220. In addition, the second A pin 220 is adjacent to the first A pin 120 of the first light source unit 10 and has a same polarity with the first A pin 120. As shown in FIG. 2A, the first A pin 120 and the second A pin 220 are respectively connected with the first signal channel 910, and the first B pin 110 and the second B pin 210 are respectively connected with the second signal channel 920. In short, if the first B pin 110 has a positive polarity, the first A pin 120 has a negative polarity, and the second A pin 220 is adjacent to the first A pin 120, wherein both of the second A pin 220 and the first A pin 120 have the negative polarity. The second B pin 210 of the second light source unit 20 is adjacent to the first B pin 110 of the subsequent first light source unit 10 (i.e. on the right hand side) and both of the second B pin 210 and the first B pin 110 have the positive polarity.

It is noted that the connection pads include a first pad 412, a second pad 422, a third pad 411, and a fourth pad 421, wherein the first pad 412, the second pad 422, the third pad 411, and the fourth pad 421 are located on the bearing surface 300. The first pad 412 and the second pad 422 are located on the bearing surface 300 and respectively connected with the first A pin 120 and the second A pin 220. The first pad 412 and the second pad 422 are connected with the first signal channel 910. Particularly, the signal channels include a positive polarity signal channel and a negative polarity signal channel, wherein the signals in a same signal channel have a same polarity.

In the embodiment, if the first A pin 120 has the positive polarity, the second A pin 220, the first pad 412, and the second pad 422 have the positive polarity and are electrically connected to the positive polarity signal channel (the first signal channel 910). Similarly, if the first B pin 110 has the negative polarity, the second B pin 210, the third pad 411, and the fourth pad 421 have the negative polarity and are electrically connected to the negative polarity signal channel (the second signal channel 920).

In addition, in the embodiment, the circuit 40 further includes a first conducting wire 50 and a second conducting wire 51, wherein the first pad 412 and the second pad 422 are respectively located on two sides of the first conducting wire 50; the third pad 411 and the fourth pad 421 are respectively located on two sides of the second conducting wire 51. Furthermore, the first pad 412 and the second pad 422 are physically connected to the two sides of the first conducting wire 50 to electrically connect the first signal channel 910; the third pad 411 and the fourth pad 421 are physically connected to the two sides of the second conducting wire 51 to electrically connect to the second signal channel 920. In practical applications, the light source module 1 utilizes the first signal channel 910 and the second signal channel 920 to electrically connect to the first light source unit 10 and the second light source unit 20 so as to drive the light source units to emit light. It is noted that the first conducting wire 50 and the second conducting wire 51 are the metal traces arranged on the substance, and the materials thereof can be copper or other metal conductors. The connection pads are metal pads, the material thereof can be tin or other metal materials which are easily soldered. In addition, the pins of the light source units are soldered on the connection pads to electrically connect to the conducting wire. In practical applications, the pins are difficult to directly connect to the wires; the connection pads provides better weldability, so the pins can be electrically connected to the conducting wire through the connection pads.

Figure 4:
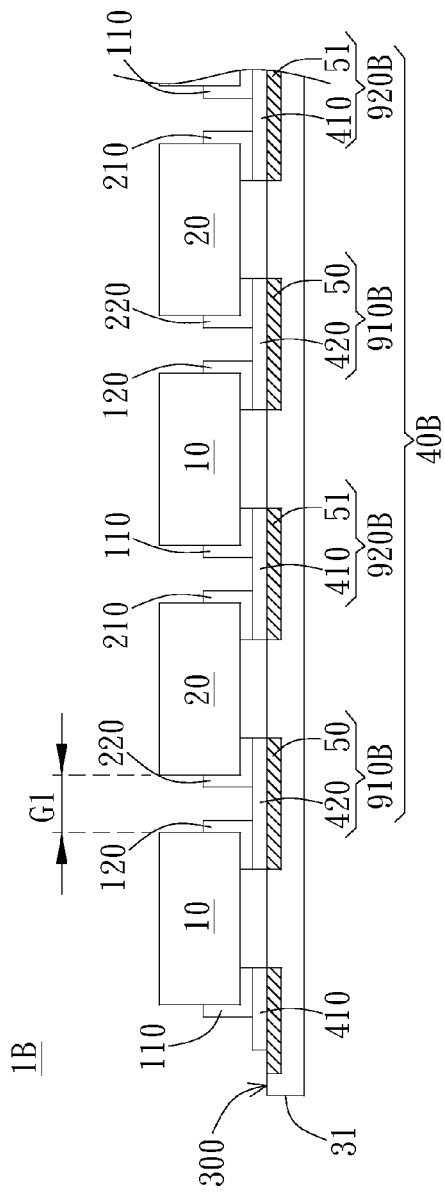
FIG. 4 is a side view of another embodiment of the light source module of the present invention.

It is noted that the present invention utilizes the first A pin 120 of the first light source unit 10 and the second A pin 220 of the adjacent second light source unit 20 having the same polarity, so that the first A pin 120 and the second A pin 220 can respectively utilize the first pad 412 and the second pad 422 to connect the first conducting wire 50 (a same conducting wire); it not only simplifies the circuit layout but also effectively decreases the spacing between the light source units. Furthermore, the present invention utilizes the first A pin 120 and the adjacent second A pin 220 having the same polarity to connect a single conducting wire (the same conducting wire) rather than respectively connecting two conducting wires (different wires). In practical applications, to reduce the amount of the conducting wires between the first light source unit 10 and the second light source unit 20 can effectively decrease layout area between the first light source unit 10 and the second light source unit 20, further minimizing the spacing between the first light source unit 10 and the second light source unit 20. In addition, in other embodiments, the first pad 412 and the second pad 422 can be two ends of a same metal pad (the metal pad 420 in FIG. 4), further reducing the spacing between the light source units. Particularly, as shown in FIG. 4, the width of the metal pad 420 is shorter than the total width of the first pad 412 and the second pad 422, and the first light source unit 10 and the second light source unit 20 share the metal pad 420, further reducing the spacing between the light source units. The detailed structure of the embodiment of FIG. 4 will be illustrated later.

It is noted that, taking 10.1-inch tablet as an example, the length of the light source module is about 216.81 mm; in other words, the area length of the light incident surface is 216.81 mm. In addition, as shown in FIG. 2A, the width W1 of the first light source unit and the width W2 of the second light source unit 20 are 3.8 mm. It is noted that the present invention decreases the amount of the conducting wires between the light source units to shorten the spacing between the first light source unit 10 and the second light source unit 20, so that the spacing G2 of the light source of the light source module 1 is 0.8 mm (the conventional spacing is 1.5 mm). Furthermore, based on the area length (216.81 mm) of the light incident surface, the widths W1/W2 of the light source units and the magnitude of the spacing G2, 48 light source units can be disposed on the light source module 1 (only 40 light source units in the conventional structure).

It is noted that for a given area length of the light incident region, the present invention can effectively increase the amount of the light source units by adjusting the pin direction of the light source units to shorten the spacing between the light source units.

In addition, if the light source unit having different specification (size) are utilized on the same light incident surface as described above, such as the width W1 of the light source unit 10 and the width W2 of the second light source unit 20 being 2.8 mm, the spacing G2 between the light source units of the light source module 1 is 1.1 mm. Based on the area length (216.81 mm) of the light incident surface, the widths W1/W2 of the light source units and the magnitude of the spacing G2, 56 light source units can be disposed on the light source module 1 (only 40 light source units in the conventional structure). Hence, when utilizing the light source units having small size, for a given area length of the light incident region, the present invention can effectively increase the amount of the light source units by adjusting the pin direction of the light source units to decrease the amount of the conducting wires, further shortening the spacing between the light source units.

In addition, taking 11.6-inch tablet as an example, the length of the light source module is about 256.13 mm; in other words, the area length of the light incident surface is 256.13 mm. In addition, as shown in FIG. 2A, the width W1 of the first light source unit 10 and the width W2 of the second light source unit 20 are 3.8 mm. It is noted that the present invention decreases the amount of the conducting wires between the light source units to shorten the spacing between the first light source unit 10 and the second light source unit 20, so that the spacing G2 of the light source of the light source module 1 is 0.8 mm. Furthermore, based on the area length (256.13 mm) of the light incident surface, the widths W1/W2 of the light source units and the magnitude of the spacing G2, 56 light source units can be disposed on the light source module 1.

It is noted that for a given area length of the light incident region, the present invention can effectively increase the amount of the light source units by adjusting the pin direction of the light source units to shorten the spacing between the light source units.

In addition, if the light source unit having different specification (size) are utilized on the same light incident surface as described above, such as the width W1 of the light source unit 10 and the width W2 of the second light source unit 20 being 2.8 mm, the spacing G2 between the light source units of the light source module 1 is 1.1 mm. Based on the area length (256.13 mm) of the light incident surface, the widths W1/W2 of the light source units and the magnitude of the spacing G2, 66 light source units can be disposed on the light source module 1 (only 56 light source units in the conventional structure). Hence, when utilizing the light source units having small size, for a given area length of the light incident region, the present invention can effectively increase the amount of the light source units by adjusting the pin direction of the light source units to decrease the amount of the conducting wires, further shortening the spacing between the light source units.

In addition, please refer to FIG. 2B; FIG. 2B is a top view of the embodiment of the light source module 1 of the present invention. As shown in FIG. 2B, the first light source units 10 and the second light source units 20 are separately disposed along a straight direction 111, the first B pins 110, the first A pins 120, the second A pins 220, and the second B pins 210 are continuously disposed in a direction parallel to the straight direction 111. It is noted that the first A pin 120 and the adjacent second A pin 220 have the same polarity, the first B pin 110 and the second B pin 210 adjacent to the first B pin 110 have the same polarity.

In addition, the first conducting wire 50 of the circuit 40 extends to an outer side of the substrate 31 between the first A pin 120 and the second A pin 220 adjacent to the first A pin 120 along a direction vertical to the straight direction 111; the second conducting wire 51 of the circuit 40 extends to an outer side of the substrate 31 between the first B pin 110 and the second B pin 210 adjacent to the first B pin 110 along the direction vertical to the straight direction 111. Particularly, the adjacent first conducting wire 50 and the second conducting wire 51 respectively extends toward different outer sides of the substrate 31. As shown in FIG. 2B, the first conducting wire 50 is adjacent to the second conducting wire 51, wherein the first conducting wire 50 extends toward a first side 100 of the substrate 31; the second conducting wire 51 extends toward a second side 200 of the substrate 31. In other words, the signal channel having the same polarity is formed on a same side of the substrate 31. If the first conducting wire 50 has the positive polarity signals, the signal channel having the positive polarity signals is near the first side 100 of the substrate 31; the second conducting wire 51 has the negative polarity signals, thus the signal channel having the negative polarity signals is near the second side 200 of the substrate 31.

Figure 3:
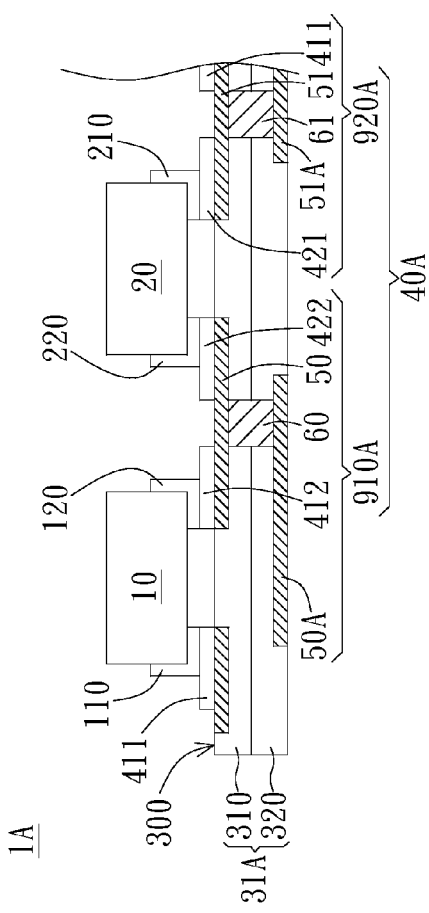
FIG. 3 is a side view of another embodiment of the light source module of the present invention.

Please refer to FIG. 3; FIG. 3 is a side view of another embodiment of the light source module of the present invention. In the embodiment, the substrate 31A of the light source module 1A is a double-layer board and includes a first circuit layer 310 and a second circuit layer 320, and the circuit layout and the electronic components are disposed on two board surfaces of the substrate 31A by practical requirements. In addition, the circuit includes vias 60 and 61, and the vias 60 and 61 pass through the first circuit layer 310 for communication between the first circuit layer 310 and the second circuit layer 320. It is noted that the vias 60 and 61 do not penetrate through the second circuit layer 320. In other words, the vias 60 and 61 respectively contact the surfaces of the first conducting wire 50A and the second conducting wire 51A (the connection surfaces of the first circuit layer 310 and the second circuit layer 320). In the embodiment, the first pad 412 and the second pad 422 are respectively connected with two sides of the same via (the via 60), and the fourth pad 421 and the third pad 411 are respectively connected with two sides of the same via (the via 61). In practical applications, the vias 60 and 61 are metal materials, wherein the via 60 can be physically connected to the conducting wire to electrically connect the first conducting wire 50 and the first conducting wire 50A, and the via 61 can be physically connected to the conducting wire to electrically connect the second conducting wire 51 and the second conducting wire 51A. Particularly, the bearing surface 300 of the light source module 1A can arrange as many first light source units 10 and second light source units 20 as the light source module 1, and the light source module 1A is the light source module having double-layer board and can utilize the second circuit layer 320 for layout and adjust the layout according to practical requirements.

Please refer to FIG. 4; FIG. 4 is a side view of another embodiment of the light source module of the present invention. In the embodiment, the light source module 1B is a single-layer board, but not limited thereto. As shown in FIG. 4, the first A pin 120 of the first light source unit 10 and the second A pin 220 of the second light source unit 20 are connected to a same pad, i.e. the metal pad 420. The first B pin 110 of the first light source unit 10 and the second B pin 210 of the second light source unit 20 are connected to a same pad, i.e. the metal pad 410. In other words, the two pads which are respectively connected to the adjacent pins of the light source module 1B can be integrated into a single pad (the metal pad 420 or 410), so that the spacing between the first light source unit 10 and the second light source unit 20 can be shortened. As shown in FIG. 4, the spacing G1 is between the first light source unit 10 and the second light source unit 20; in addition, as shown in FIG. 2A, the spacing G2 is between the first light source unit 10 and the second light source unit 20. It is noted that the embodiment of FIG. 4 utilizes the adjacent pins to connect the same metal pad, so that the spacing G1 is smaller than the spacing G2, and the substrate 31 of FIG. 4 can arrange more first light source units 10 and second light source units 20. Compared to the light source module 1 of FIG. 2A, the light source module 1A of FIG. 4 has the advantage of high brightness.

Figure 5:
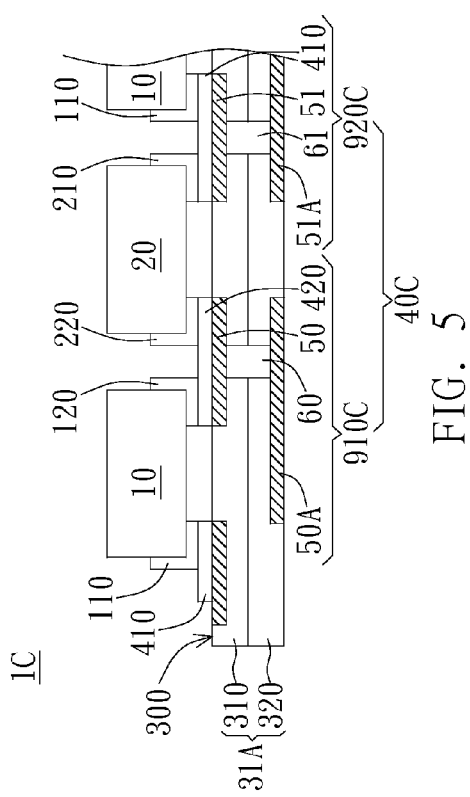
FIG. 5 is a side view of another embodiment of the light source module of the present invention.

In addition, please refer to FIG. 5; FIG. 5 is a side view of another embodiment of the light source module of the present invention. In the embodiment, the light source module 1C is a variant embodiment of the light source module 1B, i.e. the light source module 1C is a double-layer board. As shown in FIG. 5, the substrate 31A includes the first circuit layer 310 and the second circuit layer 320, and the circuit 40C includes the vias 60 and 61, and the vias 60 and 61 pass through the first circuit layer 310 for communication between the first circuit layer 310 and the second circuit layer 320, wherein a pad is connected to an end of the via 60. In the embodiment, the metal pad 420 (the same pad) which is connected with the first A pin 120 and the adjacent second A pin 220 is connected with the end of the via 60; and the metal pad 410 (the same pad) which is connected with the first B pin 110 and the adjacent second B pin 210 is connected with the end of the via 61. Particularly, the bearing surface 300 of the light source module 1C can arrange as many first light source units 10 and second light source units 20 as the light source module 1B, and the light source module 1C is the light source module having double-layer board and can utilize the second circuit layer 320 for layout and adjust the layout according to practical requirements.

Figure 6:
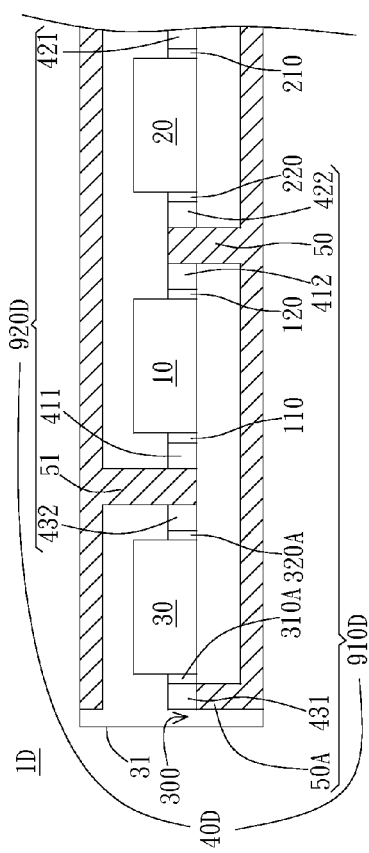
FIG. 6 is a top view of another embodiment of the light source module of the present invention.

In addition, in order to illustrate the arrangement structure of pins of adjacent light source units more specifically, an embodiment including three light source units is provided. Please refer to FIG. 6; FIG. 6 is a top view of another embodiment of the light source module of the present invention. As shown in FIG. 6, the light source module 1D includes the substrate 31, the circuit, at least one first light source unit 10, at least one second light source unit 20, and at least one third light source units 30. It is noted that the fundamental arrangement structure of the light source module 1D is illustrated based on the corresponding pin relation between the first light source unit 10 and the second light source unit 20 and the corresponding pin relation between the first light source unit 10 and the third light source unit 30. The substrate 31 has the bearing surface 300; the circuit is disposed on the substrate 31 and includes the first signal channel 910D and the second signal channel 920D. The first light source unit 10, the second light source unit 20, and the third light source unit 30 are disposed on the bearing surface 300, wherein the first light source unit 10 has a first A pin 120 and a first B pin 110 on two sides.

In addition, the second light source unit 20 has the second A pin 220 and the second B pin 210 and is located adjacent to the first A pin 120 of the first light source unit 10, wherein the second A pin 220 is disposed adjacent to the first A pin 120 and is electrically connected to the first signal channel 910D with the first A pin 120.

In practical applications, the third light source unit 30 has a third A pin 310A and a third B pin 320A and is located adjacent to the first B pin 110 of the first light source unit 10, wherein the third B pin 320A is disposed adjacent to the first B pin 110 and is electrically to the second signal channel 920D with the first B pin 110. It is noted that the first light source unit 10, the second light source unit 20, and the third light source unit 30 can be the light source units having same or different color, not limited to the embodiment. In the embodiment, the first light source unit 10, the second light source unit 20, and the third light source unit 30 are the light source units having the same color; the present invention utilizes different component symbols (10, 20, and 30) to illustrate the feature of the arrangement structure of the light source units.

In the embodiment, the circuit 40D includes the first pad 412, the second pad 422, the third pad 411, the fourth pad 421, the fifth pad 432, the sixth pad 431, the first conducting wire 50, the first conducting wire 50A, and the second conducting wire 51. It is noted that the first signal channel 910D includes the first pad 412, the second pad 422, the sixth pad 431, and the first conducting wires 50 and 50A, wherein the first pad 412 and the second pad 422 are respectively connected with two sides of the first conducting wire 50; the first A pin 120 is connected with the first pad 412; the second A pin 220 is connected with the second pad 422. In the embodiment, the first pad 412 and the second pad 422 are electrically connected with the first signal channel 910D. In addition, the third A pin 310A is connected with the sixth pad 431; the sixth pad 431 is connected with the first conducting wire 50A; the first conducting wire 50 and the first conducting wire 50A are electrically connected with the first signal channel 910D. In other words, the first A pin 120, the second A pin 220, and the third A pin 310A are respectively electrically-connected with the first signal channel 910D through the first pad 412, the second pad 422, and the sixth pad 431. For instance, the first signal channel 910D has the signals having the same polarity; if the first signal channel 910D has the positive polarity signals, the first signal channel 910D is the positive polarity signal channel.

Furthermore, the present invention utilizes the first A pin 120 and the second A pin 220 having the same polarity (the positive polarity), the two pins are connected with a single conducting wire (the same wire) to electrically connect the first signal channel 910D rather than two conducting wires (different conducting wires). In practical applications, to decrease the amount of the conducting wires between the first light source unit 10 and the second light source unit 20 can effectively reduce the layout area between the first light source unit 10 and the second light source unit 20, further shortening the spacing between the first light source unit 10 and the second light source unit 20.

In addition, the second signal channel 920D includes the third pad 411, the fifth pad 432, and the second conducting wire 51, wherein the third pad 411 and the fifth pad 432 are respectively connected with two sides of the second conducting wire 51; the first B pin 110 is connected with the third pad 411, the third B pin 320A is connected with the fifth pad 432. It is noted that the third pad 411 and the fifth pad 432 are electrically connected with the second signal channel 920D. Furthermore, the first B pin 110 and the third B pin 320A are respectively electrically-connected with the second signal channel 920D through the third pad 411 and the fifth pad 432. For instance, the second signal channel 920D has the signals having the same polarity; if the second signal channel 920D has the negative polarity signal, the second signal channel 920D is the negative polarity signal channel.

Particularly, the present invention utilizes the first B pin 110 and the third B pin 320A having the same polarity (the negative polarity), the two pins can be connected with a single conducting wire (the same wire 51) to electrically connect the second signal channel 920D rather than two conducting wires (different conducting wires). In practical applications, to decrease the amount of the conducting wires between the first light source unit 10 and the third light source unit 30 can effectively reduce the layout area between the first light source unit 10 and the third light source unit 30, further shortening the spacing between the first light source unit 10 and the third light source unit 30. In other words, the light source module 1D utilizes the pins having the same polarity to be disposed adjacently, so that the pins having the same polarity can be connected with the same conducting wire, further shortening the spacing between the light source units so as to increase the density of the light source units.

Figure 7:
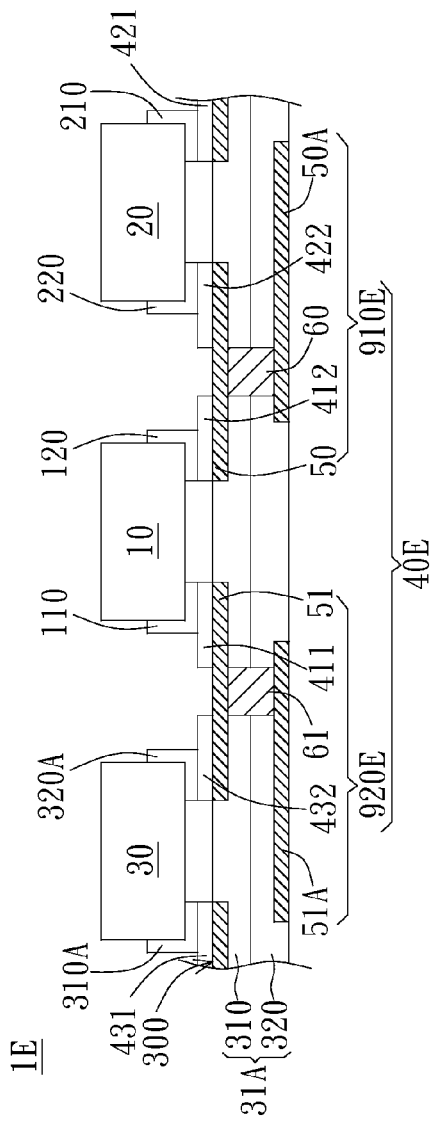
FIG. 7 is a side view of another embodiment of the light source module of the present invention.

In addition, please refer to FIG. 7; FIG. 7 is a side view of another embodiment of the light source module of the present invention. In the embodiment, the substrate 31A of the light source module 1E is a double-layer board. As shown in FIG. 7, the substrate 31A of the light source module 1E includes the first circuit layer 310 and the second circuit layer 320, and the layout and the electronic components are disposed on two board surfaces of the substrate 31A. In addition, the circuit further includes the vias 60 and 61, the first conducting wire 50A, and the second conducting wire 51A, wherein the vias 60 and 61 pass through the first circuit layer 310 for communication between the first circuit layer 310 and the second circuit layer 320. It is noted that the vias 60 and 61 do not penetrate through the second circuit layer 320. In other words, the vias 60 and 61 respectively contact the surface of the first conducting wire 50A and the second conducting wire 51A (the connection surfaces of the first circuit layer 310 and the second circuit layer 320). In the embodiment, the first pad 412 and the second pad 422 are respectively connected with two sides of the same via (the via 60); the third pad 411 and the fourth pad 421 are respectively connected with two sides of the same via (the via 61). In practical applications, the via 60 can be physically connected to the conducting wire to electrically connect the first conducting wire 50 and the first conducting wire 50A; the via 61 can be physically connected to the conducting wire to electrically connect the second conducting wire 51 and the second conducting wire 51A. Particularly, the bearing surface 300 of the light source module 1E can arrange as many first light source units 10, second light source units 20, and third light source units 30 as the light source module 1D; the light source module 1E is the light source module having double-layer board and can utilize the second circuit layer 320 for layout and adjust the layout according to practical requirements.

Figure 8:
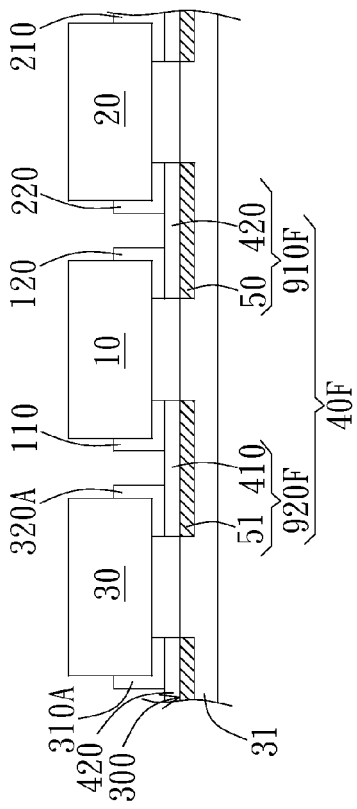
FIG. 8 is a side view of another embodiment of the light source module of the present invention.

In addition, please refer to FIG. 8; FIG. 8 is a side view of another embodiment of the light source module of the present invention. In the embodiment, the light source module 1F is a single-layer board. As shown in FIG. 8, the circuit 40F of the light source module 1F includes the metal pads 410 and 420. It is noted that the first A pin 120 and the second A pin 220 are respectively connected with two ends of the metal pad 420, and the first B pin 110 and the third B pin 320A are respectively connected with two ends of the metal pad 410. Particularly, the first A pin 120 of the first light source unit 10 and the second A pin 220 of the adjacent second light source unit 20 are connected to a same pad, i.e. the metal pad 420; the first B pin 110 of the first light source unit 10 and the third B pin 320A of the adjacent third light source unit 30 are connected to a same pad, i.e. the metal pad 410. In other words, the light source module 1F utilizes the first A pin 120 and the second A pin 120 sharing the metal pad 420, the first B pin 110 and the third B pin 320A sharing the metal pad 410, shortening the spacing between the first light source unit 10 and the second light source unit 20 and the spacing between the first light source unit 10 and the third light source unit 30 so as to increase the density of the light source units.

Figure 9:
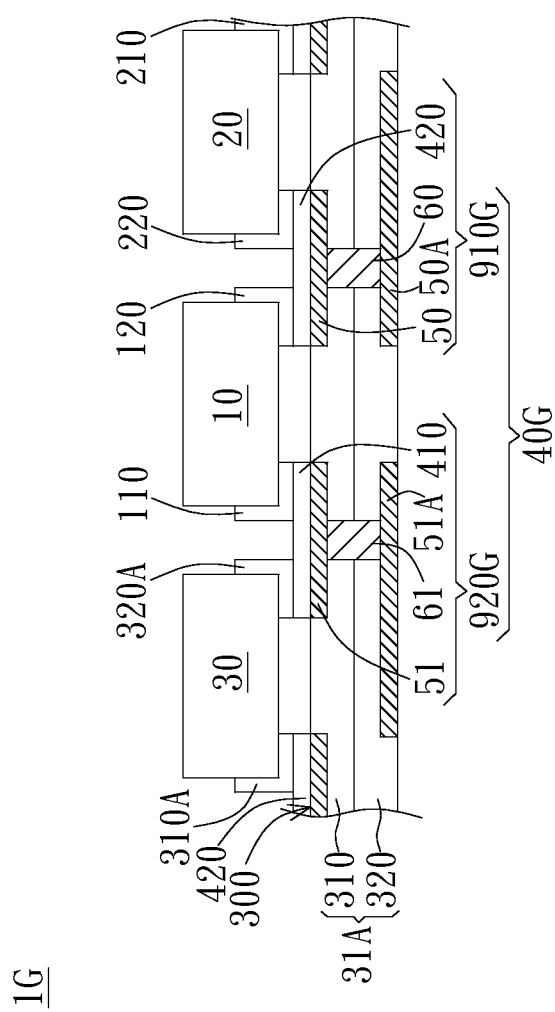
FIG. 9 is a side view of another embodiment of the light source module of the present invention.

Please refer to FIG. 9; FIG. 9 is a side view of another embodiment of the light source module of the present invention. In the embodiment, the light source module 1G is a variant embodiment of the light source module 1F and is a double-layer board. As shown in FIG. 9, the substrate 31A of the light source module 1G includes the first circuit layer 310 and the second circuit layer 320. In addition, the circuit includes the vias 60 and 61, wherein the vias 60 and 61 pass the first circuit layer 310 for communication between the first circuit layer 310 and the second circuit layer 320; the metal pads 420/410 are respectively connected with ends of the vias 60/61. In the embodiment, the metal pad 420 which is electrically connected with the first A pin 120 and the adjacent second A pin 220 is connected with the end of the via 60; the metal pad 410 (the same pad) which is electrically connected with the first B pin 110 and the third B pin 320A is connected with the end of the via 61. Particularly, the bearing surface 300 of the light source module 1G can arrange as many first light source units 10, second light source units 20, and third light source units 30 as the light source module 1F, and the light source module 1G is the light source module having double-layer board and can utilize the second circuit layer 320 for layout and adjust the layout according to practical requirements.

Compared to the prior arts, the light source module of the present invention adjusts the pin arrangement of adjacent light source units, so that the pins having the same polarity is adjacently disposed to decrease the amount of the conducting wire, decreasing the layout area between the light source units, further shortening the spacing between the first light source unit and the second light source unit. In practical applications, the light source module is a circuit board having a single strip of light bar, and the cost of the materials is cheap so as to save the cost. In practical applications, if the width of the light source unit is 3.8 mm, the prior art of FIG. 1 can accommodate only 40 light source units; however, the present invention can accommodate 48 light source units. If the width of the light source unit is 2.8 mm, the prior art of FIG. 1 can accommodate only 48 light source units; however, the present invention can accommodate 56 light source units. In other words, the light source module of the present invention can effectively reduce the spacing between the light source units to increase the amount of the light source units, further increasing the overall brightness.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A light source module, comprising:
   a substrate having a bearing surface;
   a circuit disposed on the substrate and comprising a first signal channel and a second signal channel;
   at least one first light source unit disposed on the bearing surface, wherein the first light source unit has a first A pin and a first B pin having different polarity from the first A pin; and
   at least one second light source unit disposed on the bearing surface and adjacent to one of the at least one first light source unit, wherein one of the at least one second light source unit has a second A pin and a second B pin having different polarity from the second A pin, and the second A pin is adjacent to the first A pin of the first light source unit and has a same polarity with the first A pin; the first A pin and the second A pin are respectively connected with the first signal channel, and the first B pin and the second B pin are respectively connected with the second signal channel;
   wherein the circuit further comprises a first pad and a second pad, wherein the first pad and the second pad are located on the bearing surface and respectively connected with the first A pin and the second A pin, and the first pad and the second pad are connected with the first signal channel, and
   wherein the first pad and the second pad are respectively two ends of a same metal pad.

2. The light source module of claim 1, wherein the circuit comprises a conducting wire, the first pad and the second pad are electrically connected with two sides of the conducting wire, respectively.

3. The light source module of claim 1, wherein the substrate at least comprises a first circuit layer and a second circuit layer, the circuit comprises a via, and the via passes through the first circuit layer for communication between the first circuit layer and the second circuit layer, the first pad and the second pad are respectively connected with two sides of the via.

4. The light source module of claim 1, wherein the substrate comprises a first circuit layer and a second circuit layer, the circuit comprises a via, and the via passes through the first circuit layer for communication between the first circuit layer and the second circuit layer, the same metal pad is connected with an end of the via.

5. The light source module of claim 1, wherein the at least one first light source unit and the at least one second light source unit are separately disposed along a straight direction, the first B pin, the first A pin, the second A pin, and the second B pin are sequentially disposed in a direction parallel to the straight direction, and the first B pin and the second B pin adjacent to the first B pin have the same polarity.

6. The light source module of claim 5, wherein the circuit comprises a first conducting wire and a second conducting wire, and the first conducting wire and the second conducting wire respectively extend to an outer side of the substrate between the first A pin and the second A pin adjacent to the first A pin and between the first B pin and the second B pin adjacent to the first B pin along a direction vertical to the straight direction, and the adjacent first conducting wire and the second conducting wire respectively extends toward a different outer side of the substrate.

7. A light source module, comprising:
   a substrate having a bearing surface;
   a circuit disposed on the substrate and comprising a first signal channel and a second signal channel;
   a first light source unit disposed on the bearing surface, wherein the first light source unit respectively has a first A pin and a first B pin on two sides;
   a second light source unit disposed on the bearing surface and adjacent to the first A pin of the first light source unit, wherein the second light source unit has a second A pin and a second B pin, and the second A pin is disposed to be adjacent to the first A pin and is electrically connected to the first signal channel with the first A pin; and
   a third light source unit disposed on the bearing surface and adjacent to the first B pin of the first light source unit; wherein the third light source unit has a third A pin and a third B pin, and the third B pin is disposed adjacent to the first B pin and is electrically to the second signal channel with the first B pin;
   wherein the circuit comprises a metal pad, the first A pin and the second A pin are respectively connected with two ends of the metal pad.

8. The light source module of claim 7, wherein the circuit comprises a first pad, a second pad, and a conducting wire, the first pad and the second pad are respectively connected with two sides of the conducting wire; the first A pin is connected with the first pad; the second A pin is connected the second pad, and the first pad and the second pad are electrically connected with the first signal channel, and wherein the first pad and the second pad are respectively two ends of the metal pad.

9. The light source module of claim 7, wherein the substrate comprises a first circuit layer and a second circuit layer, the circuit comprises a via, a first pad, and a second pad, and the via passes through the first circuit layer for communication between the first circuit layer and the second circuit layer; the first pad and the second pad are respectively connected with two sides of the via; the first A pin is connected with the first pad; the second A pin is connected with the second pad, and wherein the first pad and the second pad are respectively two ends of the metal pad.

10. The light source module of claim 7, wherein the substrate at least comprises a first circuit layer and a second circuit layer, the circuit comprises a via, and the via passes through the first circuit layer for communication between the first circuit layer and the second circuit layer, wherein the metal pad is connected with an end of the via.

* * * * *